US009678160B2

(12) United States Patent
Horikawa et al.

(10) Patent No.: US 9,678,160 B2
(45) Date of Patent: Jun. 13, 2017

(54) INDUSTRIAL AUTOMATIC-DIAGNOSTIC DEVICE

(75) Inventors: Tomo Horikawa, Tokyo (JP); Kunio Ooba, Tokyo (JP); Taku Watanabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 294 days.

(21) Appl. No.: 13/881,106

(22) PCT Filed: Dec. 9, 2010

(86) PCT No.: PCT/JP2010/072118
§ 371 (c)(1),
(2), (4) Date: Apr. 23, 2013

(87) PCT Pub. No.: WO2012/077210
PCT Pub. Date: Jun. 14, 2012

(65) Prior Publication Data
US 2013/0241586 A1 Sep. 19, 2013

(51) Int. Cl.
*G01R 31/3187* (2006.01)
*G05B 23/02* (2006.01)

(52) U.S. Cl.
CPC ..... *G01R 31/3187* (2013.01); *G05B 23/0267* (2013.01)

(58) Field of Classification Search
CPC ............ G01R 31/3187; G01R 31/2884; G01R 31/3004; G01R 31/31715; G01R 31/31707; G05B 23/0267; H01L 22/34
(Continued)

(56) References Cited

U.S. PATENT DOCUMENTS 4,985,857 A * 1/1991 Bajpai ................ G05B 19/4065
702/184
5,369,756 A * 11/1994 Imura ................... G06F 11/321
706/914
(Continued)

FOREIGN PATENT DOCUMENTS

DE 10319551 A1 11/2004
DE 102008048552 A1 4/2010
(Continued)

OTHER PUBLICATIONS

Mouri et al JP2002333917 A (English Machine Translation; Published Nov. 22, 2002.*
(Continued)

*Primary Examiner* — Melissa Koval
*Assistant Examiner* — Felicia Farrow
(74) *Attorney, Agent, or Firm* — Sughrue Mion, PLLC; Richard C Turner

(57) ABSTRACT

An industrial automatic-diagnostic device connected to an FA system in which a plurality of FA devices are connected to each other, the industrial automatic-diagnostic device includes: an engineering tool; and a display unit. Based on interface connection information and device configuration information of a corresponding FA device held by each of the FA devices, the engineering tool creates overall configuration information of the FA system and displays an overall configuration of the FA system on the display unit based on the overall configuration information. When an abnormality occurs in the FA device, diagnosis information about an abnormal part self-diagnosed by the FA device and abnormality contents with respect to the abnormality occurred in a corresponding abnormal part is obtained. Based on the obtained diagnosis information, occurrence of an abnormal-
(Continued)

ity is displayed in an abnormal part in an overall configuration of the FA system displayed on the display unit.

20 Claims, 10 Drawing Sheets

(58) Field of Classification Search
 USPC ........................................................ 324/750.3
 See application file for complete search history.

(56) References Cited

U.S. PATENT DOCUMENTS

| | | | | |
|---|---|---|---|---|
| 6,587,812 | B1* | 7/2003 | Takayama | ..................... 702/182 |
| 7,324,855 | B2 | 1/2008 | Ushiku et al. | |
| 7,600,200 | B2* | 10/2009 | K | .......................... G05B 15/02 700/17 |
| 2005/0007249 | A1* | 1/2005 | Eryurek | ............... G05B 23/027 340/511 |
| 2006/0064188 | A1 | 3/2006 | Ushiku et al. | |
| 2006/0241907 | A1* | 10/2006 | Armstrong | ......... G05B 23/0218 702/182 |
| 2010/0205535 | A1 | 8/2010 | Mitamura et al. | |
| 2011/0137447 | A1 | 6/2011 | Hermann et al. | |

FOREIGN PATENT DOCUMENTS

| | | | |
|---|---|---|---|
| JP | 1-256896 A | | 10/1989 |
| JP | 7-104839 A | | 4/1995 |
| JP | 07104839 A | * | 4/1995 |
| JP | 9-81226 A | | 3/1997 |
| JP | 2002-333917 A | | 11/2002 |
| JP | 2002333917 A | * | 11/2002 |
| JP | 2005-100027 A | | 4/2005 |
| JP | 2005100027 A | * | 4/2005 |
| JP | 2009-15041 A | | 1/2009 |
| JP | 2009-301417 A | | 12/2009 |
| JP | 2010-257097 A | | 11/2010 |
| TW | 2006-19887 A | | 6/2006 |
| WO | 2008/146380 A1 | | 12/2008 |

OTHER PUBLICATIONS

Fukushima JP 2005100027 A (English Machine Translation; Published Apr. 14, 2005).*
Sugawara et al JP 07104839 A (English Machine Translation; Published Apr. 21, 1995).*
Communication dated Feb. 2, 2015 from the State Intellectual Property Office of the People's Republic of China in counterpart application No. 201080070502.1.
Taiwanese Office Action, dated Dec. 26, 2014, Application No. 100117170.
Communication dated Sep. 29, 2016, issued by the German Patent Office in counterpart German Application No. 112010006057.6.

* cited by examiner

INDUSTRIAL AUTOMATIC-DIAGNOSTIC DEVICE

CROSS REFERENCE TO RELATED APPLICATIONS

This application is a National Stage of International Application No. PCT/JP2010/072118 filed Dec. 9, 2010, the contents of all of which are incorporated herein by reference in their entirety.

FIELD

The present invention relates to an industrial automatic-diagnostic device using an engineering tool.

BACKGROUND

In recent years, in maintenances of an FA (Factory Automation) system, systems that even inexperienced engineers can easily perform an abnormality diagnosis have been desired. However, in many cases, the FA system has a hierarchical structure in which a plurality of networks are combined together, and connection setting involved in an abnormality diagnosis and knowledge required for the abnormality diagnosis are complicated.

As a system in which a PLC (Programmable Logic Controller: sequencer) or the like is its system constituent element, there have been disclosed techniques such as: a distributed control system that regards one of PLCs connected to each other via a network as a setting-information transmitting station and holds frame configuration data also from a handy tool by a memory card (see Patent Literature 1); an abnormality diagnostic system that connects a computer to a PLC, automatically detects an abnormal state of a production facility, and provides related instruction information to a user (see Patent Literature 2); and an apparatus that displays all unit devices of a sequence control device in a tree arrangement so as to display fault information for each device (see Patent Literature 3).

CITATION LIST

Patent Literatures

Patent Literature 1: Japanese Patent Application Laid-open No. 2009-15041
Patent Literature 2: Japanese Patent Application Laid-open No. 7-104839
Patent Literature 3: Japanese Patent Application Laid-open No. 2005-100027

SUMMARY

Technical Problem

However, according to the conventional techniques, when an abnormality diagnosis is performed in an FA product (an FA system), a user of an engineering tool needs to manually set a connection destination and manually diagnose. Therefore, techniques required for connection setting need to be learned by training or the like and it takes a long time for the connection setting itself. Furthermore, there is a problem that, when the abnormality diagnosis is performed, there are a variety of causes of an abnormality and thus it is difficult to identify the cause of the abnormality.

The present invention has been made in view of the above problems, and an object of the present invention is to provide an industrial automatic-diagnostic device that can automatically perform an abnormality diagnosis of an FA system by an engineering tool.

Solution to Problem

To solve the above described problems and achieve the object an industrial automatic-diagnostic device that is connected to an FA system in which a plurality of FA devices are connected to each other, the industrial automatic-diagnostic device includes: an engineering tool; and a display unit. Based on interface connection information and device configuration information of a corresponding FA device held by each of the FA devices, the engineering tool creates overall configuration information of the FA system and displays an overall configuration of the FA system on the display unit based on the overall configuration information. When an abnormality occurs in the FA device, diagnosis information about an abnormal part self-diagnosed by the FA device and abnormality contents with respect to the abnormality occurred in a corresponding abnormal part is obtained. Based on the obtained diagnosis information, occurrence of an abnormality is displayed in an abnormal part in an overall configuration of the FA system displayed on the display unit. When the displayed abnormal part or the displayed abnormality occurrence is selected on the display unit, a configuration of a unit constituting an FA device including the abnormal part is displayed and occurrence of an abnormality in a unit with an abnormality having occurred therein is displayed in a configuration of the unit.

Advantageous Effects of Invention

According to the present invention, an abnormality diagnosis of an FA system can be automatically performed.

DESCRIPTION OF EMBODIMENTS

Exemplary embodiments of an industrial automatic-diagnostic device and an FA system according to the present invention will be explained below in detail with reference to the accompanying drawings. The present invention is not limited to the embodiments.

Embodiment

Figure 1:
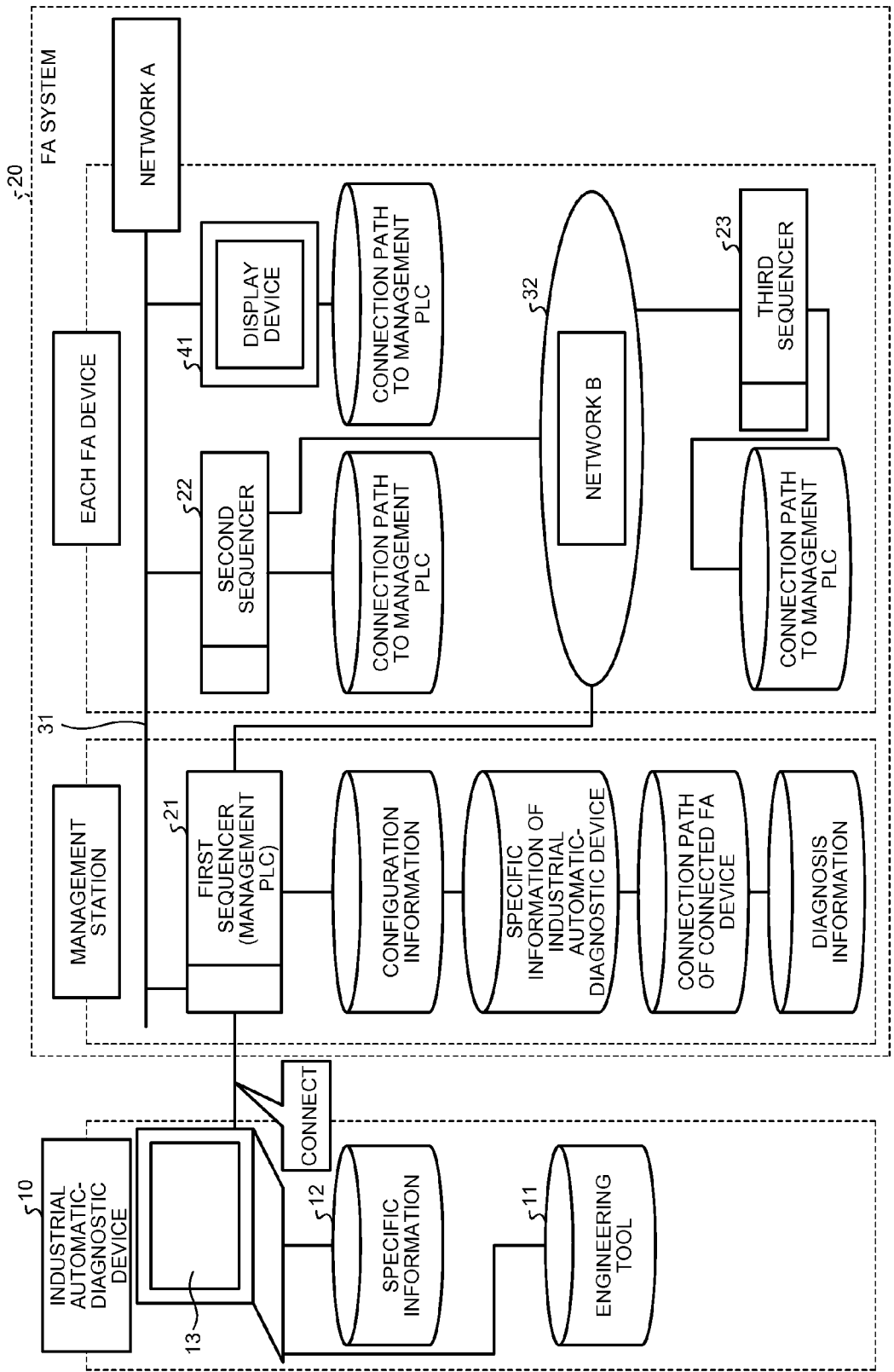
FIG. 1 depicts a configuration of an FA system and an industrial automatic-diagnostic device connected to the FA system according to an embodiment of the present invention.

FIG. 1 depicts a configuration of an FA system 20 and an industrial automatic-diagnostic device 10 connected to the FA system 20 according to an embodiment of the present invention. The industrial automatic-diagnostic device 10 (an abnormality diagnostic device) is a personal computer, for example, an engineering tool 11 is installed therein, and includes a display 13 as a display unit for a user. The display unit for a user does not need to be the display 13. The type of the display unit for a user is not particularly limited as long as it is, for example, a display unit that by which its user can understand contents thereon at a glance, such as in a printed-out form.

The engineering tool 11 is software that executes, for example, programming, monitoring of programming, system structuring, display/setting/trace of data values, and monitoring/operating of each of FA devices and a unit as a lower-level apparatus constituting each of the FA devices with respect to the FA system 20.

The configuration of the FA system 20 illustrated in FIG. 1 is an example, and a first sequencer 21 that is an FA device connected to the industrial automatic-diagnostic device 10 to communicate with the engineering tool 11 is a management PLC. The FA system 20 includes a second sequencer 22, a third sequencer 23, and a display device 41 as other FA devices.

The first sequencer 21, the second sequencer 22, and the display device 41 are connected to a network A 31; and the first sequencer 21, the second sequencer 22, and the third sequencer 23 are connected to a network B 32 that is formed in a ring shape, for example. In the present example: the first sequencer 21 (the management PLC) is configured to manage information of the FA system 20 intensively and to communicate with the industrial automatic-diagnostic device 10.

Each of FA devices such as the first sequencer 21, the second sequencer 22, the third sequencer 23, and the display device 41 has data related to its interface connection information and device configuration information of a lower level apparatus of each corresponding FA device and can self-diagnose an abnormality when an abnormality occurs in any one of the FA devices. Each of the FA devices can inform the first sequencer 21 (the management PLC) of information including an abnormal part that is self-diagnosed by the corresponding FA device and contents of the abnormality occurred in the abnormal part. An informable abnormal part and informable contents of an abnormality are referred to as "abnormality diagnosis information".

The configuration of the FA system 20 illustrated in FIG. 1 is only an example. Differently to this example, the FA system 20 may employ a distributed network configuration. According to the distributed network configuration, at an equal footing, each of the FA device (such as a PLC) has data related to its interface connection information and device configuration information of each of the FA devices and further obtains the abnormality diagnosis information mentioned above by a self diagnosis to directly communicate with the industrial automatic-diagnostic device 10 to inform the abnormality diagnosis information.

An operation in a normal state will be explained below with reference to a flowchart in the normal state illustrated in FIG. 2 by taking the configuration of the FA system 20 and the industrial automatic-diagnostic device 10 connected to the FA system 20 illustrated in FIG. 1 as an example.

The first sequencer 21 as the management PLC holds interface (I/F) connection information and device configuration information of each of the FA devices including the first sequencer 21, the second sequencer 22, the third sequencer 23, and the display device 41 on the FA system 20. Interface (I/F) connection information and the device configuration information of the FA devices other than those of the first sequencer 21 are collected and held in advance by communicating between the first sequencer 21 and each of the FA devices (Step S11).

Next, the industrial automatic-diagnostic device 10 is connected to the FA system 20. In this case, the industrial automatic-diagnostic device 10 is connected to the first sequencer 21 as the management PLC (Step S12). The first sequencer 21 as the management PLC obtains specific information 12 of the connected industrial automatic-diagnostic device 10 (Step S13). The specific information 12, for example, is information such as an IP address, a MAC address, and a network number.

Figure 3:
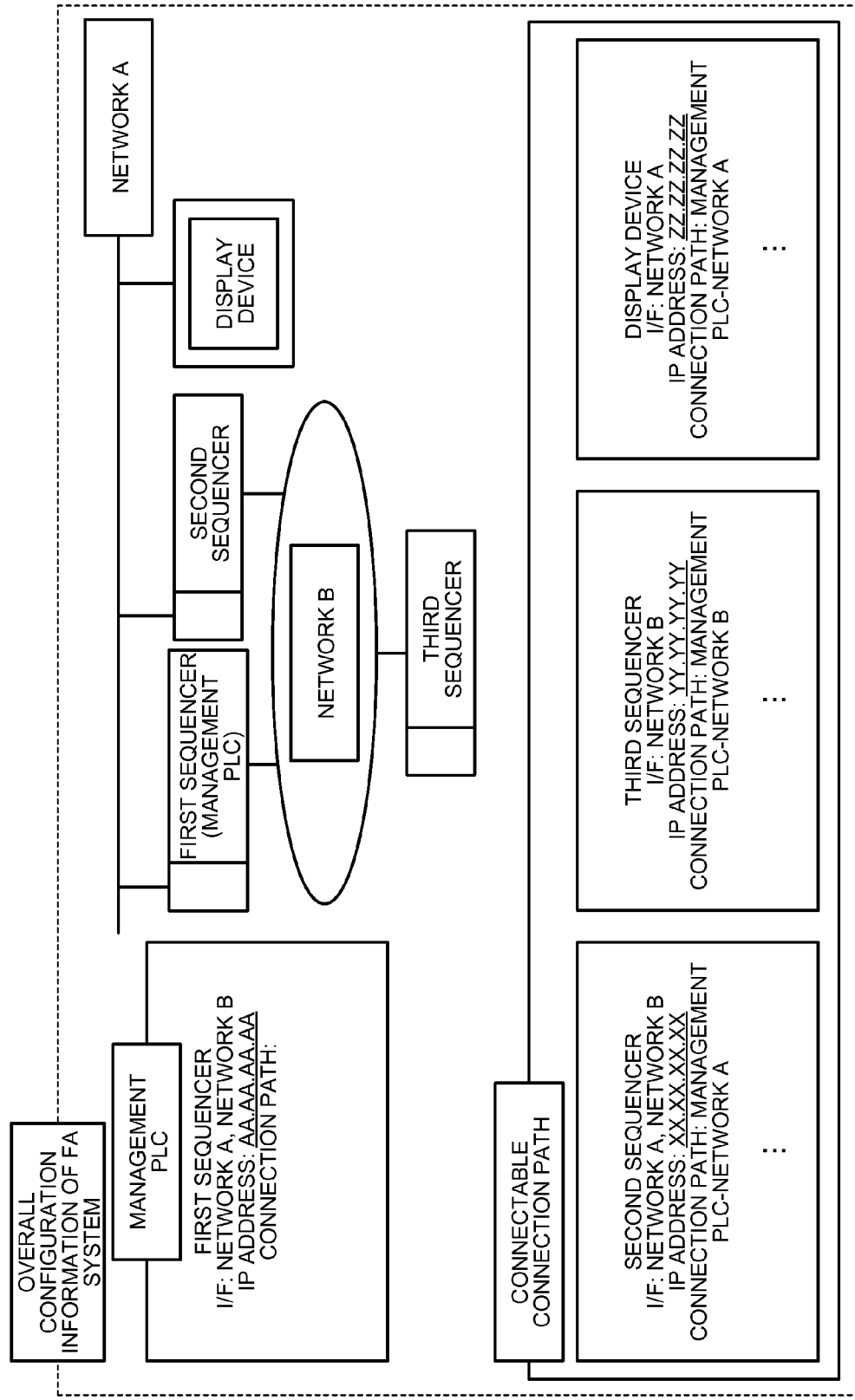
FIG. 3 depicts a screen showing an overall configuration of an FA system displayed on a display.

The engineering tool 11 installed in the industrial automatic-diagnostic device 10 creates overall configuration information of the FA system 20 based on the interface (I/F) connection information and the device configuration information of the respective FA devices including the first sequencer 21, the second sequencer 22, the third sequencer 23, and the display device 41 held by the first sequencer 21 as the management PLC; and the engineering tool 11 displays these pieces of information on the display 13 (Step S14). On the display 13, a screen showing an overall configuration of the FA system 20 illustrated in FIG. 3 is displayed.

The engineering tool 11 can also obtain a connection path from each of the FA devices to the industrial automatic-diagnostic device 10, as well as created overall configuration information of the FA system 20. This information may be simultaneously displayed on the display 13 as "connectable connection path" for each of the FA devices as illustrated in FIG. 3. The "connectable connection path" includes interface (I/F) connection information, the name of a network through which a connection path passes, and specific information (such as an IP address).

In a case of the system configuration illustrated in FIG. 1, illustrated as an example in the present embodiment, in which the first sequencer 21 as the management PLC intensively manages information of the FA system 20 to communicate with the industrial automatic-diagnostic device 10, the connection path from each of the FA devices to the industrial automatic-diagnostic device 10 is substantially the same as a connection path from each of the FA devices to the management PLC.

Next, the first sequencer 21 as the management PLC transmits the connection path to the management PLC to each of the FA devices connected (Step S15). With this process, each of the FA devices holds the connection path to the management PLC, that is, the connection path to the industrial automatic-diagnostic device 10 and can communicate with the industrial automatic-diagnostic device 10 when an abnormality occurs.

Figure 4:
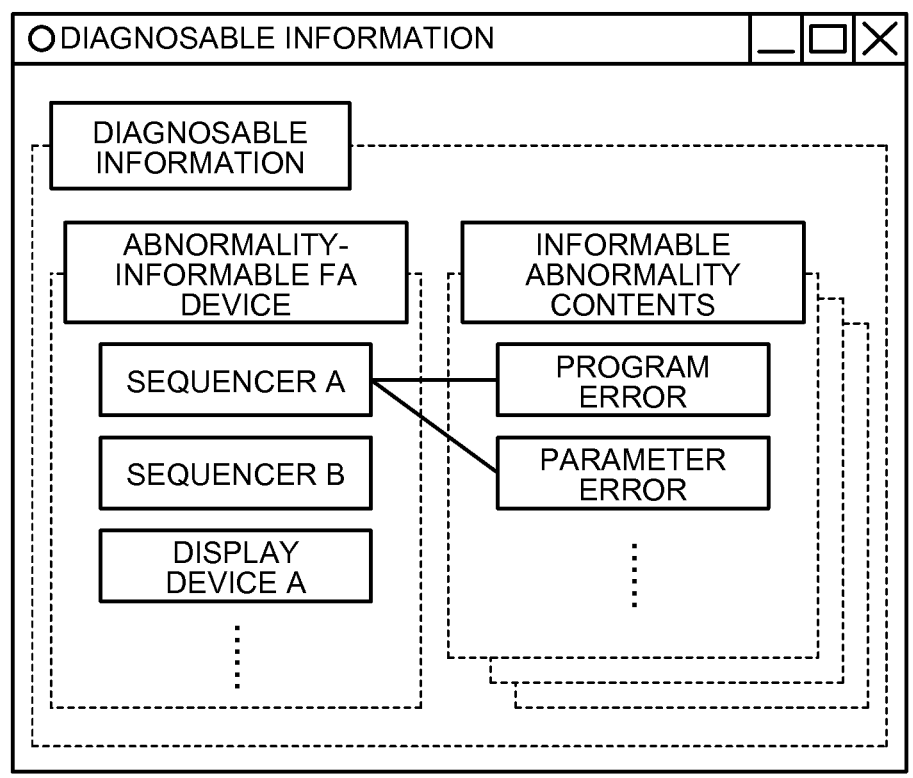
FIG. 4 depicts diagnosable information including an abnormality informable FA device that can inform the industrial automatic-diagnostic device of an abnormality and informable abnormality contents.

The first sequencer 21 as the management PLC and the industrial automatic-diagnostic device 10 hold diagnosable information illustrated in FIG. 4. The diagnosable information is a list of an abnormality-informable FA device that can inform the industrial automatic-diagnostic device 10 of an abnormality when the abnormality occurs and informable abnormality contents based on information received by the first sequencer 21 as the management PLC from each of the FA devices.

Differently to the present embodiment in which the management PLC intensively manages the FA system, in a case of a distributed network configuration in which each of the FA devices (such as a PLC) directly communicates with and informs the industrial automatic-diagnostic device 10 at an equal footing, it suffices that the industrial automatic-diagnostic device 10 informs each of the FA devices of the connection path to the industrial automatic-diagnostic device 10 without via the management PLC.

Figure 5:
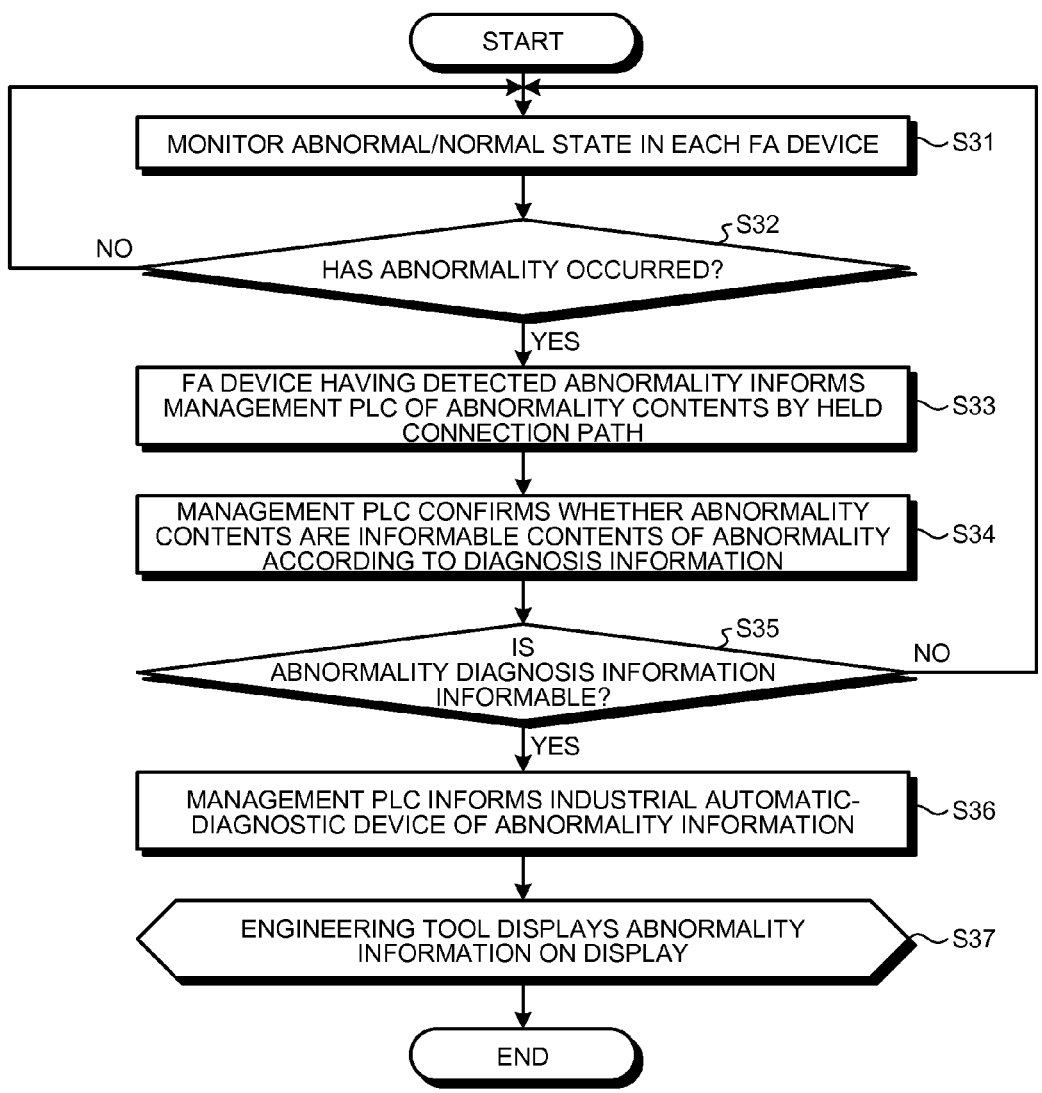
FIG. 5 is a flowchart of an operation that is performed by the industrial automatic-diagnostic device and the FA system when an abnormality occurs.

An operation when an abnormality occurs will be explained next with reference to a flowchart illustrated in FIG. 5. First, each of the FA devices self-diagnoses and monitors by itself whether each of the FA devices is in an abnormal state or in a normal state (Step S31) constantly or on an as-needed basis. When an abnormality is not found in each of the FA devices (NO at Step S32), a monitoring mode is continued. When an abnormality occurs (YES at Step S32), an FA device having detected the abnormality informs the first sequencer 21 as the management PLC of abnormality diagnosis information about an abnormal part self-diagnosed by the FA device and contents of the abnormality occurred in the abnormal part by a held connection path (Step S33).

Next, the first sequencer 21 as the management PLC determines whether the abnormality diagnosis information received from each of the FA devices is informable contents of an abnormality according to the diagnosable information illustrated in FIG. 4 (Step S34). When the abnormality diagnosis information is not informable (NO at Step S35), the process returns to the monitoring mode (Step S31). When the abnormality diagnosis information is informable (YES at Step S35), the first sequencer 21 as the management PLC informs the industrial automatic-diagnostic device 10 having the held specific information 12 obtained at Step S13 in FIG. 2 of the abnormality diagnosis information (Step S36). The engineering tool 11 mounted on the industrial automatic-diagnostic device 10 displays abnormality information on the display 13 based on the informed abnormality diagnosis information (Step S37).

In the case of the distributed network FA system, which has a different configuration from the configuration of a centralized management system illustrated in the present embodiment as an example, the above abnormality diagnosis may be configured as a polling system in which the industrial automatic-diagnostic device 10 (the engineering tool 11) sequentially sends a diagnose request packet to each of the FA devices and each of the FA devices responds to the industrial automatic-diagnostic device 10 (the engineering tool 11) about a self diagnosis result.

Figure 6:
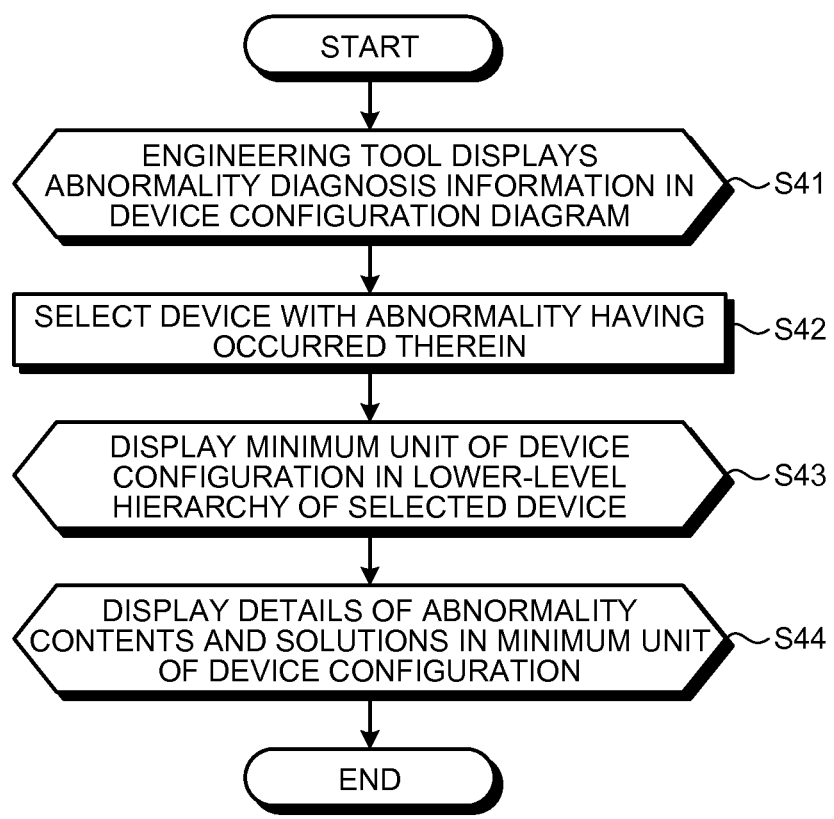
FIG. 6 is a flowchart of an operation that is performed when an engineering tool incorporated in the industrial automatic-diagnostic device displays abnormality diagnosis information on a display.

An operation when the engineering tool 11 mounted on the industrial automatic-diagnostic device 10 displays informed abnormality information on the display 13 is illustrated in a flowchart of FIG. 6.

Figure 2:
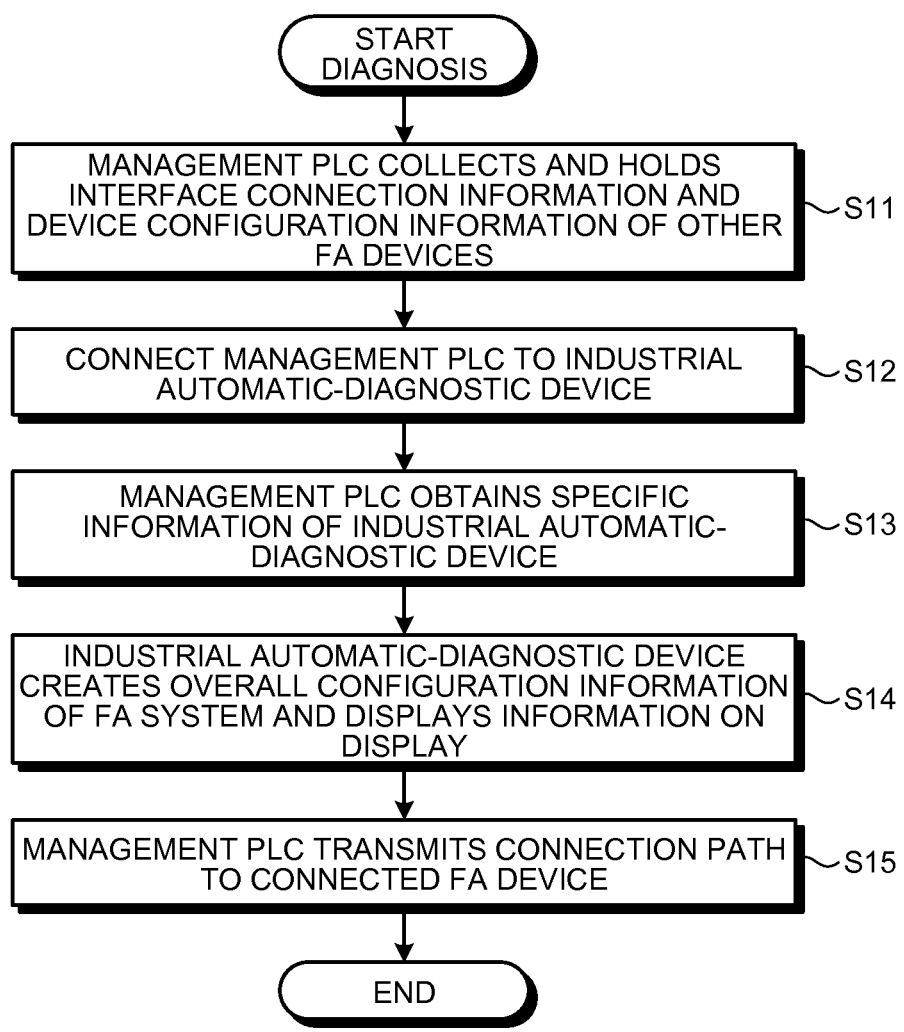
FIG. 2 is a flowchart of operations of the industrial automatic-diagnostic device and the FA system in a normal state.
Figure 7:
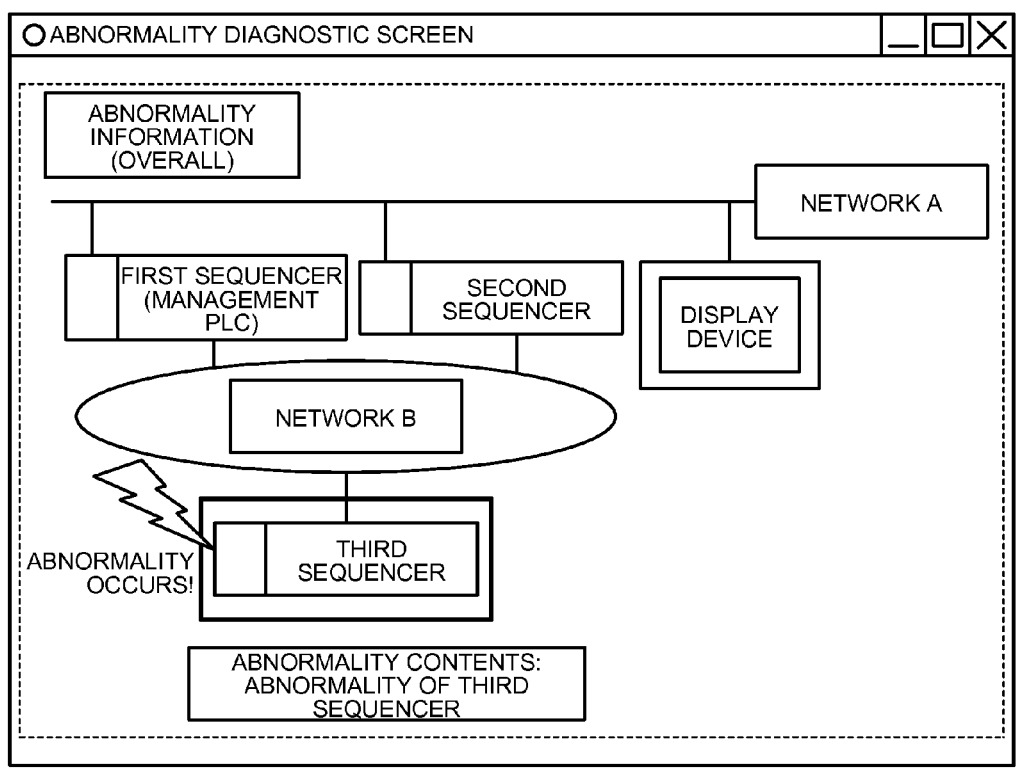
FIG. 7 depicts an abnormality diagnostic screen for an overall configuration diagram of the FA system displayed on a display of the industrial automatic-diagnostic device.

First, the engineering tool 11 mounted on the industrial automatic-diagnostic device 10 displays information based on obtained abnormality diagnosis information on the screen illustrated in FIG. 3 indicating the overall configuration of the FA system 20 displayed on the display 13 at Step S14 in FIG. 2, as illustrated in FIG. 7 (Step S41). Specifically, "abnormality occurs" is displayed in the abnormal part and "abnormality contents" is further displayed. The example of FIG. 7 indicates that an abnormality has occurred in the third sequencer 23 and an abnormality of the third sequencer 23 is displayed as "abnormality contents". It may be configured such that when an abnormality occurs, the industrial automatic-diagnostic device 10 may issue an alarm sound and the abnormal part, for example, may flicker to inform the abnormality to a user (a maintenance personnel).

Figure 8:
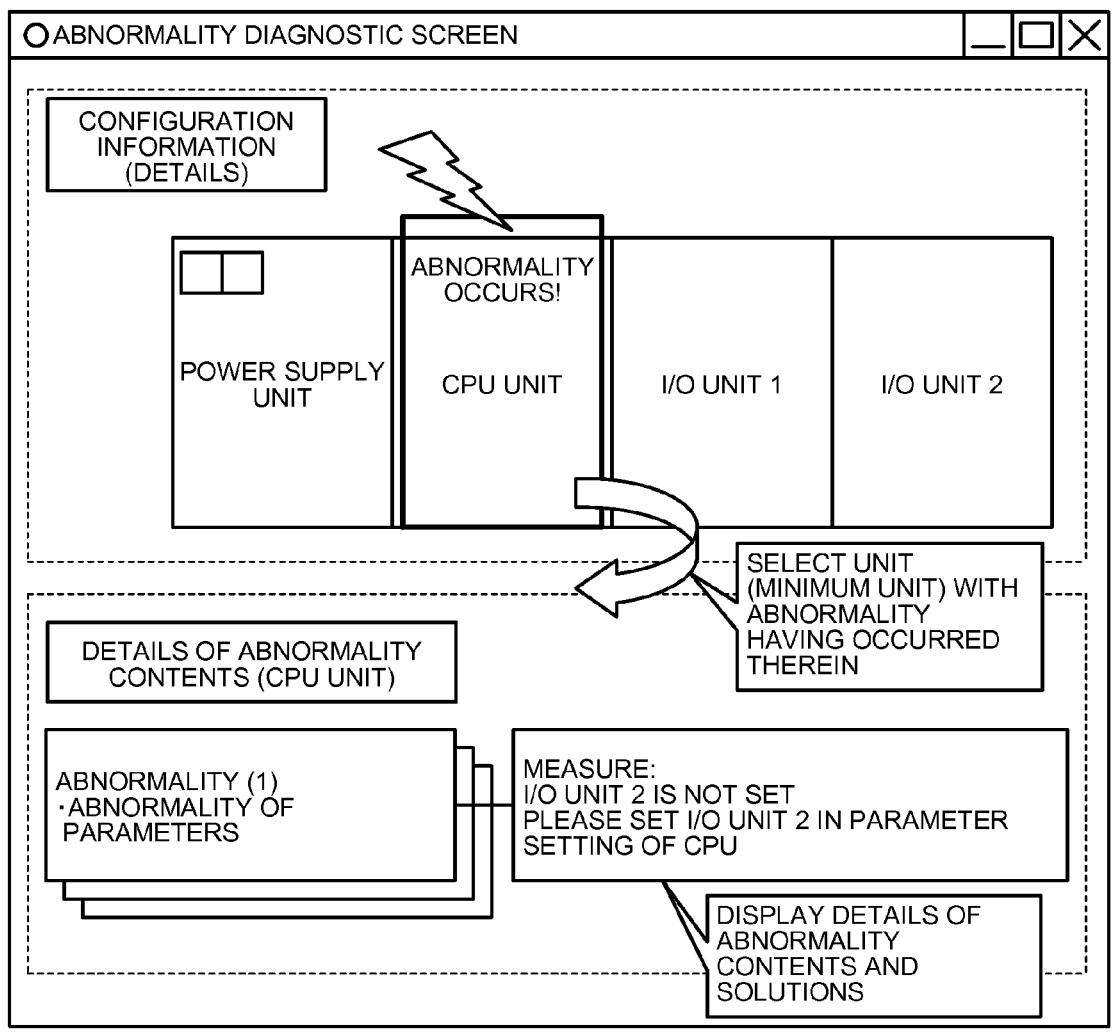
FIG. 8 depicts an abnormality diagnostic screen when a configuration of an apparatus (a unit) at a lower level of an FA device in which an abnormality occurs.

In this case, when the user selects the abnormal part displaying "abnormality occurs" or "abnormality contents" on the screen illustrated in FIG. 7 (Step S42), a configuration of an apparatus (a unit) at a lower level of the third sequencer 23 is displayed (Step S43) and a unit in which an abnormality is occurred is displayed as illustrated in FIG. 8. As also illustrated in FIG. 8, when "abnormality contents" is selected, details of the abnormality contents are displayed and candidates for the cause of the abnormality corresponding to the abnormality contents are displayed (Step S44). Subsequently, when a cause of the abnormality included in the candidates for the cause of the abnormality is selected, candidates for a measure against the cause of the abnormality are displayed (Step S44). Conventionally, candidates for the measures against the causes of the abnormality are information described in a manual or the like. According to the present embodiment, a trouble of manually examining measures is eliminated and the work efficiency of the user can be improved.

Figure 9:
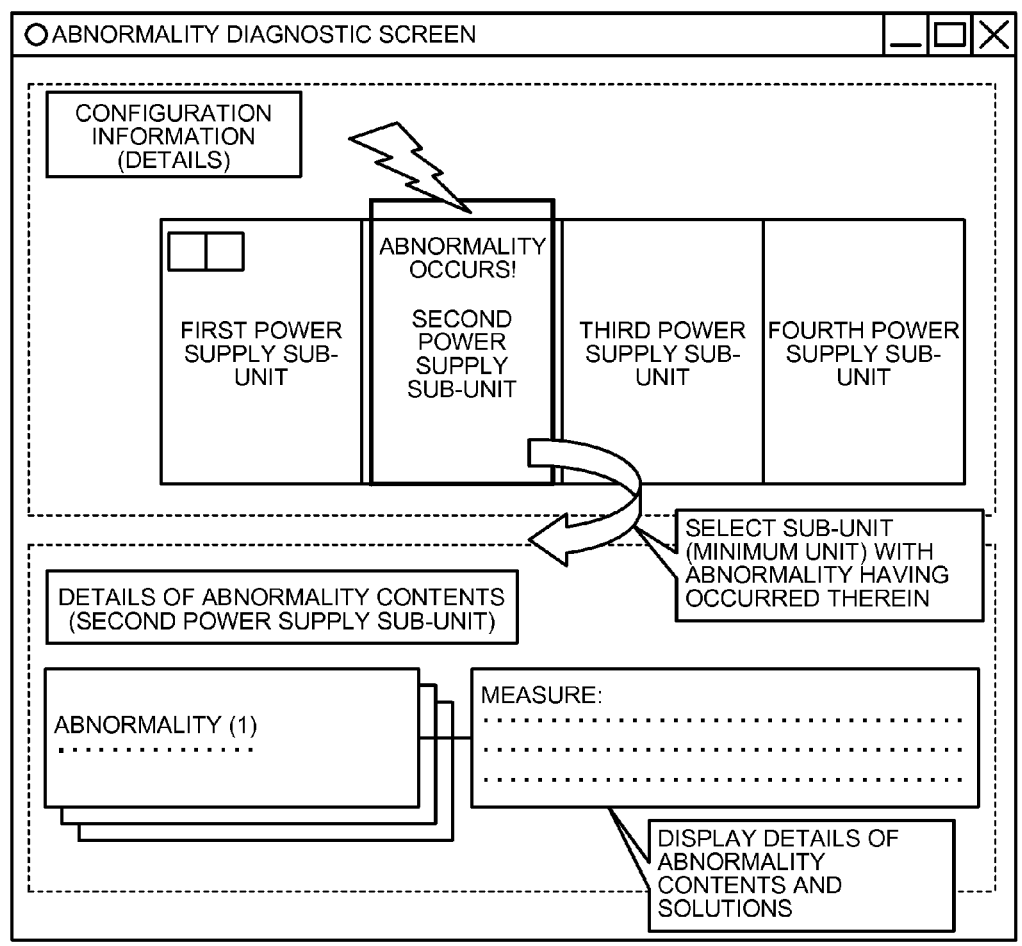
FIG. 9 depicts an abnormality diagnostic screen when a configuration of an apparatus (a sub-unit) at a lower level of the apparatus (the unit) at the lower level of the FA device in which an abnormality occurs.

The case illustrated in FIG. 8 is a case where, for example, "CPU unit" is the minimum unit of the device configuration. However, for example, when "power supply unit" illustrated in FIG. 8 further includes a plurality of sub-units, each of which serves as the minimum unit of the device configuration and an abnormality occurs on a sub-unit basis and this abnormality can be identified, as illustrated in FIG. 9 the user selects "power supply unit" in FIG. 8 (Step S42); a lower level of the device configuration is displayed (Step S43), and the abnormality contents, the cause of the abnormality, and measures against the abnormality at that level can be displayed (Step S44). The example of FIG. 9 illustrates an example in which an abnormality occurs in "second power supply sub-unit", which constitutes "power supply unit".

As explained above, according to the present embodiment, the device configuration is expanded to the minimum unit and displayed (Step S43) by a selection of the user (Step S42), and when the minimum unit is selected, details of the abnormality contents, the cause of the abnormality, and candidates for the measure are displayed (Step S44).

In the above embodiment, while a case where there is one abnormality has been explained, when a plurality of faults occur simultaneously, simultaneously occurred abnormalities may be prioritized such as a heavy fault as a serious abnormality and a light fault as a minor abnormality. The faults may be then informed (displayed) in the order of the heavy fault to the light fault. When a time period during which a certain FA device is switched off and its operation is stopped as a scheduled maintenance is set in advance, it can be configured such that information such as diagnosable information in FIG. 4 mentioned above includes a condition that an abnormality does not need to be informed during that time period, so that it is not determined as an abnormality.

Figure 10:
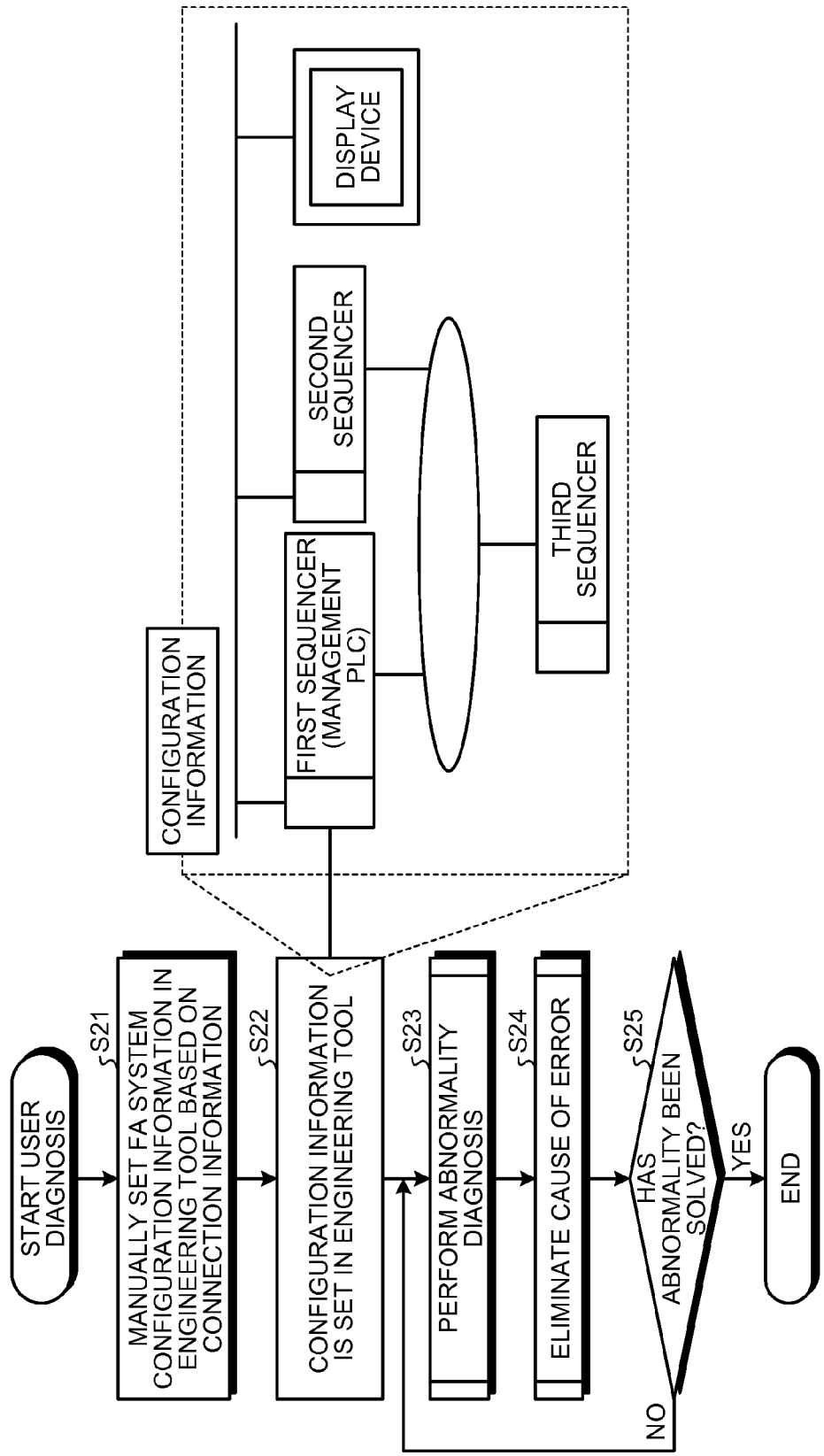
FIG. 10 is a flowchart of a conventional method of performing an abnormality diagnosis in an FA product (an FA system).

A conventional method of performing an abnormality diagnosis in an FA product (an FA system) is illustrated in a flowchart of FIG. 10. In a conventional abnormality diagnosis, a user of an engineering tool manually sets configuration information of the FA system based on connection information of each of the FA devices in a personal computer having the engineering tool incorporated therein (Step S21). Even after the configuration information is set in the engineering tool (Step S22), the user needs to manually diagnose an abnormality (Step S23). The cause of the abnormality needs to be eliminated by a manual work (Step S24) and Steps S23 to S25 are repeated until the abnormality is solved. Accordingly, techniques required for connection setting need to be learned by training or the like, and it takes a long time for the connection setting itself.

Generally, the system configuration of the FA system changes depending on the purpose of its user and usage environment. Accordingly, as for how FA devices are connected to each other is not known when the devices are installed. In other words, the user does not know the configuration of the FA system when the FA system has just been installed. This system configuration is conventionally created by human power as explained above based on interface connection information and device configuration information of the FA devices.

According to the present embodiment, an engineering tool automatically creates overall configuration information of an FA system based on interface connection information and device configuration information of the FA device and displays an overall configuration of the FA system on a display unit based on the overall configuration information. Furthermore, when an abnormality occurs in a certain FA device, information about the abnormality is automatically collected, and a part where the abnormality occurs, the contents thereof, the cause thereof, and the measures against it are displayed on the display unit displaying the overall configuration of the FA system additionally and hierarchically. Because the user of the engineering tool does not set a connection destination, the time and knowledge required for the setting are unnecessary for the user. Further, the cause of the abnormality can be easily determined when the user performs an abnormality diagnosis.

As explained above, the industrial automatic-diagnostic device according to the present embodiment causes, for example, a management PLC connected to the industrial automatic-diagnostic device constituted by a personal computer or the like automatically collect abnormality information of all FA devices in an FA network. Alternatively, the industrial automatic-diagnostic device automatically collects abnormality information of all FA devices in an FA network. Furthermore, solutions together with collected abnormality information are provided, via a display unit on which an overall configuration of an FA system is displayed, to a user.

The invention of the present application is not limited to the above embodiment and can be variously modified without departing from the spirit of the invention at the practical stage. Furthermore, in the above embodiment, inventions of various stages are included, and various inventions can be extracted by appropriately combining a plurality of constituent elements disclosed therein.

For example, even when some constituent elements are omitted from all constituent elements described in the embodiment, as far as the problems mentioned in the section of Solution to Problem can be solved and effects mentioned in the section of Advantageous Effects of Invention are obtained, the configuration from which these constituent elements have been omitted can be extracted as an invention. Furthermore, the constituent elements described in the embodiment can be appropriately combined.

INDUSTRIAL APPLICABILITY

As described above, the industrial automatic-diagnostic device according to the present invention is useful for an automatic abnormality diagnosis of a network system of a device, and is particularly suitable for an automatic abnormality diagnosis of an industrial FA system using an engineering tool.

REFERENCE SIGNS LIST 10 industrial automatic-diagnostic device
11 engineering tool
12 specific information
13 display
20 FA system
21 first sequencer (management PLC)
22 second sequencer
23 third sequencer
31 network A
32 network B
41 display device
S11 to S15, S21 to S25, S31 to S37, S41 to S44 step

The invention claimed is:

1. An industrial automatic-diagnostic device that is connected to a factory automation (FA) system in which a plurality of FA devices are connected to each other, the industrial automatic-diagnostic device comprising:
an engineering tool executed on a processor; and
a display unit, wherein
based on interface connection information and device configuration information respectively held by and received from each of the FA devices, the engineering tool creates overall configuration information of the FA system and displays an overall configuration of the FA system on the display unit based on the overall configuration information,
when an abnormality occurs in one of the FA devices, the engineering tool obtains diagnosis information about an abnormal part self-diagnosed by the FA device and abnormality contents with respect to the abnormality occurring in the abnormal part, the obtained diagnosis information being received by the engineering tool in response to the FA device self-diagnosing the abnormal part using circuitry housed within the FA device,
based on the obtained diagnosis information, the display unit displays an occurrence of the abnormality in the abnormal part in the overall configuration of the FA system displayed on the display unit, and
in response to the displayed abnormal part or the displayed abnormality occurrence being selected on the display unit, the display unit displays a configuration of a unit constituting an FA device including the abnormal part and an occurrence of an abnormality in the unit with an abnormality having occurred therein in a configuration of the unit,
wherein the engineering tool receives a result of a determination, from the FA system, regarding whether the obtained diagnosis information is informable content and selectively displays the occurrence of the abnormality in the abnormal part in the overall configuration of the FA system displayed on the display unit in response to the determination.

2. An industrial automatic-diagnostic device that is connected to a factory automation (FA) system in which a plurality of FA devices are connected to each other, the industrial automatic-diagnostic device comprising:
an engineering tool executed on a processor; and
a display unit, wherein
based on interface connection information and device configuration information respectively held by and received from each of the FA devices, the engineering tool creates overall configuration information of the FA system and displays an overall configuration of the FA system on the display unit based on the overall configuration information,
when an abnormality occurs in one of the FA devices, the engineering tool obtains diagnosis information about an abnormal part self-diagnosed by the FA device and abnormality contents with respect to the abnormality occurring in the abnormal part, the obtained diagnosis information being received by the engineering tool in response to the FA device self-diagnosing the abnormal part using circuitry housed within the FA device,
based on the obtained diagnosis information, the display unit displays the abnormality contents together with the overall configuration of the FA system displayed on the display unit, and
in response to the displayed abnormality contents being selected on the display unit, the display unit displays a configuration of a unit constituting an FA device including the abnormal part and an occurrence of an abnormality in the unit with an abnormality having occurred therein in a configuration of the unit,
wherein the engineering tool receives a result of a determination, from the FA system, regarding whether the obtained diagnosis information is informable content and selectively displays the abnormality contents together with the overall configuration of the FA system displayed on the display unit in response to the determination.

3. An industrial automatic-diagnostic device that is connected to a factory automation (FA) system in which a plurality of FA devices are connected to each other, the industrial automatic-diagnostic device comprising:
an engineering tool executed on a processor; and
a display unit, wherein
based on interface connection information and device configuration information respectively held by and received from each of the FA devices, the engineering tool creates overall configuration information of the FA system and displays an overall configuration of the FA system on the display unit based on the overall configuration information,
when an abnormality occurs in one of the FA devices, the engineering tool obtains diagnosis information about an abnormal part self-diagnosed by the FA device and abnormality contents with respect to the abnormality occurring in the abnormal part, the obtained diagnosis information being received by the engineering tool in response to the FA device self-diagnosing the abnormal part using circuitry housed within the FA device,
based on the obtained diagnosis information, the display unit displays an occurrence of the abnormality in the abnormal part in the overall configuration of the FA system displayed on the display unit,
based on the obtained diagnosis information, the display unit displays the abnormality contents together with the overall configuration of the FA system displayed on the display unit, and
in response to the displayed abnormality contents being selected on the display unit, the display unit displays a configuration of a unit constituting an FA device including the abnormal part and an occurrence of an abnormality in the unit with an abnormality having occurred therein in a configuration of the unit,
wherein the engineering tool receives a result of a determination, from the FA system, regarding whether the obtained diagnosis information is informable content and selectively displays the occurrence of the abnormality in the abnormal part, along with the abnormality contents, in the overall configuration of the FA system displayed on the display unit in response to the determination.

4. An industrial automatic-diagnostic device that is connected to a factory automation (FA) system in which a plurality of FA devices are connected to each other, the industrial automatic-diagnostic device comprising:
an engineering tool executed on a processor; and
a display unit, wherein
based on interface connection information and device configuration information respectively held by and received from each of the FA devices, the engineering tool creates overall configuration information of the FA system and displays an overall configuration of the FA system on the display unit based on the overall configuration information,
when an abnormality occurs in one of the FA devices, the engineering tool obtains diagnosis information about an abnormal part self-diagnosed by the FA device and abnormality contents with respect to the abnormality occurring in the abnormal part, the obtained diagnosis information being received by the engineering tool in response to the FA device self-diagnosing the abnormal part using circuitry housed within the FA device,
based on the obtained diagnosis information, the display unit displays the abnormality contents together with the overall configuration of the FA system displayed on the display unit, and
in response to the abnormality contents being selected on the display unit, the display unit displays candidates for a cause of the abnormality,
wherein the engineering tool receives a result of a determination, from the FA system, regarding whether the obtained diagnosis information is informable content and selectively displays the abnormality contents together with the overall configuration of the FA system displayed on the display unit in response to the determination.

5. An industrial automatic-diagnostic device that is connected to a factory automation (FA) system in which a plurality of FA devices are connected to each other, the industrial automatic-diagnostic device comprising:
an engineering tool executed on a processor; and
a display unit, wherein
based on interface connection information and device configuration information respectively held by and received from each of the FA devices, the engineering tool creates overall configuration information of the FA system and displays an overall configuration of the FA system on the display unit based on the overall configuration information, when an abnormality occurs in one of the FA devices, the engineering tool obtains diagnosis information about an abnormal part self-diagnosed by the FA device and abnormality contents with respect to the abnormality occurring in the abnormal part, the obtained diagnosis information being received by the engineering tool in response to the FA device self-diagnosing the abnormal part using circuitry housed within the FA device, based on the obtained diagnosis information, the display unit displays an occurrence of the abnormality in the abnormal part in the overall configuration of the FA system displayed on the display unit, based on the obtained diagnosis information, the display unit displays the abnormality contents together with the overall configuration of the FA system displayed on the display unit, and in response to the abnormality contents being selected on the display unit, the display unit displays candidates for a cause of the abnormality, wherein the engineering tool receives a result of a determination, from the FA system, regarding whether the obtained diagnosis information is informable content and selectively displays the occurrence of the abnormality in the abnormal part, along with the abnormality contents, in response to the determination.

6. The industrial automatic-diagnostic device according to claim 1, wherein in response to the unit constituting the FA device including a sub-unit as a lower-level device configuration being selected on the display unit, the display unit displays an occurrence of an abnormality in the sub-unit with the abnormality having occurred therein in the unit constituting the FA device, and when the sub-unit includes a lower-level hierarchical structure, by hierarchically repeating a selection and display of an occurrence of an abnormality on the display unit, the display unit displays a device configuration of the sub-unit expanded to a minimum unit and an occurrence of an abnormality.

7. The industrial automatic-diagnostic device according to claim 1, wherein the display unit displays the abnormality contents together with the abnormality occurrence.

8. The industrial automatic-diagnostic device according to claim 7, wherein in response to the abnormality contents being selected on the display unit, the display unit displays candidates for a cause of the abnormality.

9. The industrial automatic-diagnostic device according to claim 8, wherein in response to a cause of the abnormality included in the candidates for the cause of the abnormality being selected on the display unit, the display unit displays a measure against the cause of the abnormality.

10. The industrial automatic-diagnostic device according to claim 2, wherein in response to the unit constituting the FA device including a sub-unit as a lower-level device configuration being selected on the display unit, the display unit displays an occurrence of an abnormality in the sub-unit with the abnormality having occurred therein in the unit constituting the FA device, and when the sub-unit includes a lower-level hierarchical structure, by hierarchically repeating a selection and display of an occurrence of an abnormality on the display unit, the display unit displays a device configuration of the sub-unit expanded to a minimum unit and an occurrence of an abnormality.

11. The industrial automatic-diagnostic device according to claim 2, wherein the display unit displays the abnormality contents together with the abnormality occurrence.

12. The industrial automatic-diagnostic device according to claim 11, wherein in response to the abnormality contents being selected on the display unit, the display unit displays candidates for a cause of the abnormality.

13. The industrial automatic-diagnostic device according to claim 12, wherein in response to a cause of the abnormality included in the candidates for the cause of the abnormality being selected on the display unit, the display unit displays a measure against the cause of the abnormality.

14. The industrial automatic-diagnostic device according to claim 3, wherein in response to the unit constituting the FA device including a sub-unit as a lower-level device configuration being selected on the display unit, the display unit displays an occurrence of an abnormality in the sub-unit with the abnormality having occurred therein in the unit constituting the FA device, and when the sub-unit includes a lower-level hierarchical structure, by hierarchically repeating a selection and display of an occurrence of an abnormality on the display unit, the display unit displays a device configuration of the sub-unit expanded to a minimum unit and an occurrence of an abnormality.

15. The industrial automatic-diagnostic device according to claim 3, wherein the display unit displays the abnormality contents together with the abnormality occurrence.

16. The industrial automatic-diagnostic device according to claim 15, wherein in response to the abnormality contents being selected on the display unit, the display unit displays candidates for a cause of the abnormality.

17. The industrial automatic-diagnostic device according to claim 16, wherein in response to a cause of the abnormality included in the candidates for the cause of the abnormality being selected on the display unit, the display unit displays a measure against the cause of the abnormality.

18. The industrial automatic-diagnostic device according to claim 4, wherein in response to the unit constituting the FA device including a sub-unit as a lower-level device configuration being selected on the display unit, the display unit displays an occurrence of an abnormality in the sub-unit with the abnormality having occurred therein in the unit constituting the FA device, and when the sub-unit includes a lower-level hierarchical structure, by hierarchically repeating a selection and display of an occurrence of an abnormality on the display unit, the display unit displays a device configuration of the sub-unit expanded to a minimum unit and an occurrence of an abnormality.

19. The industrial automatic-diagnostic device according to claim 5, wherein in response to the unit constituting the FA device including a sub-unit as a lower-level device configuration being selected on the display unit, the display unit displays an occurrence of an abnormality in the sub-unit with the abnormality having occurred therein in the unit constituting the FA device, and when the sub-unit includes a lower-level hierarchical structure, by hierarchically repeating a selection and display of an occurrence of an abnormality on the display unit, the display unit displays a device configuration of the sub-unit expanded to a minimum unit and an occurrence of an abnormality.

20. The industrial automatic-diagnostic device according to claim 1, wherein the informable contents comprises contents corresponding to a particular group of abnormalities to be notified to the industrial automatic-diagnostic device, among abnormalities including the particular group and another group of abnormalities that are not to be notified to the industrial automatic-diagnostic device.

* * * * *